April 15, 1958 A. HAHNEL 2,831,115

FREQUENCY CONTROL CIRCUIT

Filed June 5, 1956

INVENTOR.

ALWIN HAHNEL

BY Harry M. Saragovitz

ATTORNEY 2,831,115
Patented Apr. 15, 1958

1

2,831,115

FREQUENCY CONTROL CIRCUIT

Alwin Hahnel, Little Silver, N. J., assignor to the United States of America as represented by the Secretary of the Army Application June 5, 1956, Serial No. 589,568

6 Claims. (Cl. 250—36)

Figures 1, 2:
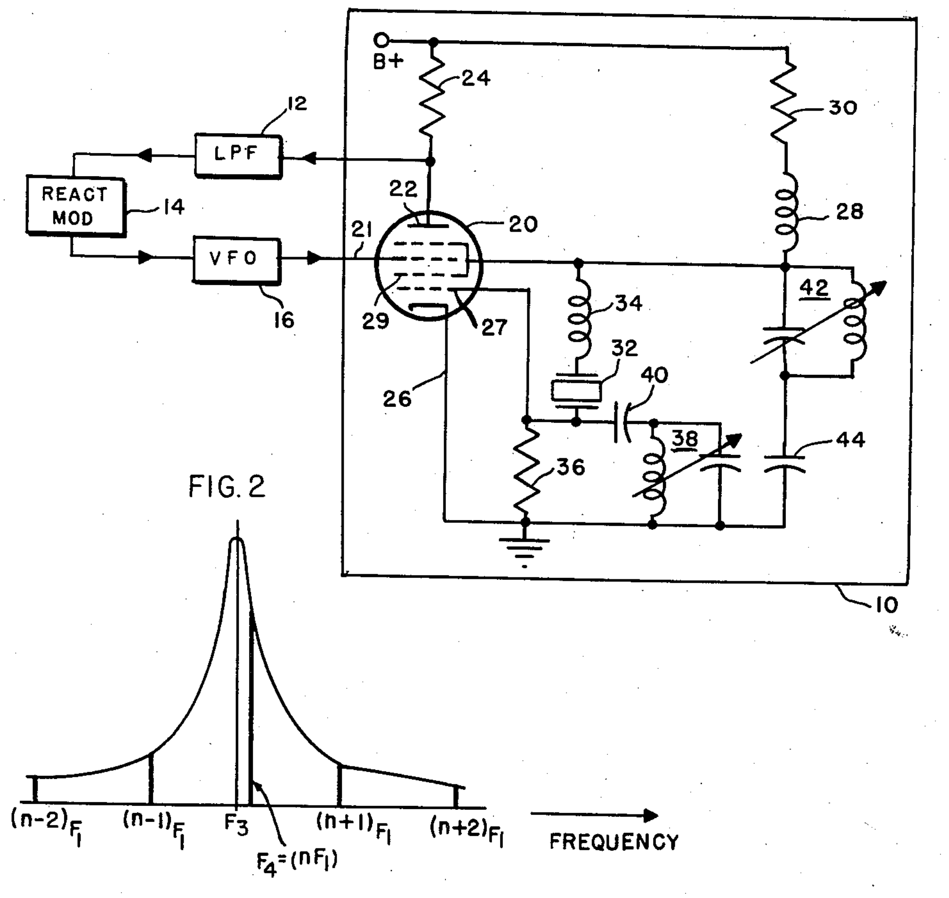

(Granted under Title 35, U. S. Code (1952), sec. 266)

The invention described herein may be manufactured and used by or for the Government for governmental purposes, without the payment of any royalty thereon.

This invention relates to frequency control systems and more particularly to crystal controlled phase discriminators utilized in such systems.

In many communication systems utilizing the output of a variable frequency oscillator (VFO), crystal controlled oscillators are employed as reference frequency sources to stabilize and lock-in the output VFO frequency. The VFO output is usually synchronized to a harmonic of the crystal oscillator output so that the VFO frequency is an exact integral multiple of the fundamental crystal frequency. Such synchronization is usually controlled by the output of a multi-electrode mixer tube having a pair of input grids to which the externally generated reference frequency and the VFO frequency output are respectively applied. The externally generated reference frequency is applied in the form of narrow rectangular pulses at a crystal controlled repetition frequency. The plate output from such a mixer is a function of the phase difference between the rectangular pulses and the VFO signal, such that the error voltage obtained from the mixer plate output will control frequency and phase until phase-lock becomes established when the VFO frequency is harmonically related to the crystal controlled pulse repetition frequency. For operation at very high order harmonics of the crystal controlled fundamental oscillation, such systems require complex pulse shaping circuits to provide rectangular pulses of very narrow duration. This difficulty is especially encountered in cases where the VFO output is required to be step-controlled at relatively high harmonics of the pulse repetition frequency which is the fundamental of the desired output frequencies. Another disadvantage of the conventional system is due to the fact that relatively large amplitude reference pulses are required. This not only leads to complex pulse generator circuits but often results in the generation of a large number of spurious responses caused by the large amplitude of the undesired low order harmonics of the pulse repetition frequency.

It is therefore an object of the present invention to provide a crystal controlled phase discriminator wherein such limitations are overcome.

It is another object of the present invention to provide a phase discriminator especially adapted to operate at very high order harmonics of the crystal controlled fundamental oscillation.

It is yet another object of the present invention to provide a crystal controlled reference frequency source which completely eliminates the need for pulse generating circuits.

In accordance with the present invention there is provided a frequency control circuit wherein the output of a source of oscillatory energy is stabilized and phase-locked at a frequency harmonically related to a prescribed reference frequency. There is included a multigrid vacuum tube having its plate output applied to the input of the oscillatory energy source through a low pass filter and a reactance modulator, and having one of its grids connected to the output of the oscillatory source. Also included are means in circuit with at least two other grids and the cathode of the tube for simultaneously generating the reference frequency and a spectrum of frequencies harmonically related thereto, the spectrum frequency generating means being responsive to the reference frequency for selectively utilizing the prescribed stabilizing harmonic frequency. When the source oscillation frequency and the harmonic oscillation frequency are not in exact synchronism, the beat frequency output of the plate is applied to the oscillatory source through the low-pass filter and the reactance modulator in a manner such that the output oscillation frequency of the source is driven toward the prescribed harmonic frequency. When the two frequencies are equal, the oscillation of said source and the prescribed harmonic oscillation are in phase-lock and the control voltage derived from the plate is now a function of the phase difference between the oscillatory energy and the prescribed harmonic frequency.

For a better understanding of the present invention, together with other and further objects thereof, reference is had to the following description taken in connection with the accompanying drawing in which:

Fig. 1 schematically illustrates the frequency control system, and

Figure 3:
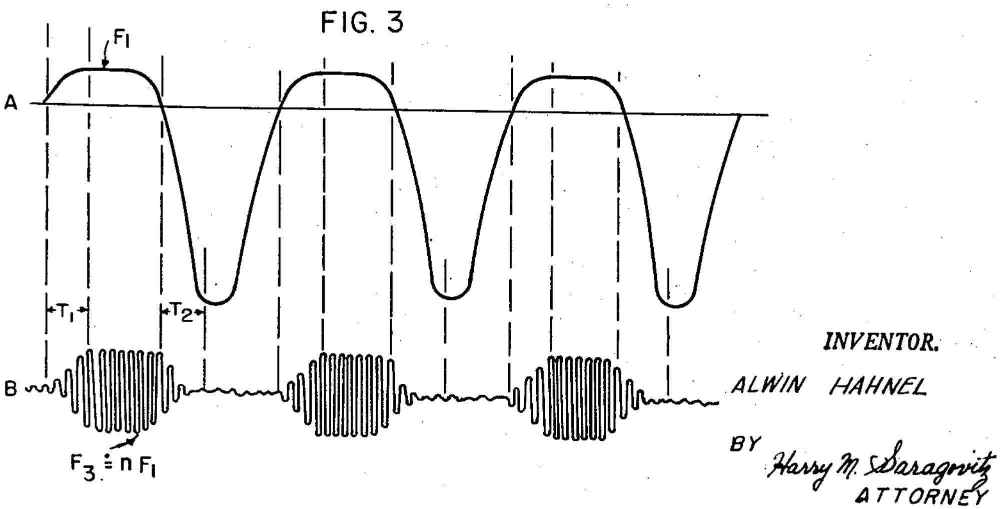

Figs. 2 and 3 show a group of explanatory curves to illustrate the operation of the periodically phase-controlled oscillator associated with the circuit shown in Fig. 1.

Referring now to Fig. 1, the crystal controlled phase discriminator is shown at 10 as one element of a frequency control loop which includes low-pass filter 12, reactance modulator 14 and variable frequency oscillator 16. Phase discriminator 10 includes a multigrid tube 20 having its third grid 21 coupled to the output of VFO 16 and its plate 22 connected to B+ through resistor 24. Cathode 26, first grid 27, and second grid 29 of tube 20 effectively provide the respective cathode, control grid, and plate of a triode tube which, with its associated circuitry hereinbelow described, provides a spectrum of harmonically related frequencies any one of which may be selectively utilized as the crystal controlled reference oscillation. As shown, the second grid 29 and the fourth grid of tube 20 are tied together and are connected to B+ through series connected choke 28 and resistor 30. The fundamental frequency for all the harmonically related reference frequencies is provided by crystal 32 having one terminal connected to first grid 27 and the other terminal connected to second grid 29 through choke coil 34. Cathode 26 is grounded and first grid 27 is connected to ground through resistor 36. A first tunable resonant circuit 38, adapted to be tuned over a relatively wide range of frequencies harmonically related to the crystal frequency, is coupled between first grid 27 and ground. One terminal of resonant circuit 38 is coupled to grid 27 through capacitor 40 and the other terminal thereof is connected directly to ground. A second tunable resonant circuit 42, adapted to be tuned over substantially the same wide range of frequencies as resonant circuit 38, is coupled between grid 29 and ground. As shown, one terminal of resonant circuit 42 is connected to second grid 29 and the other terminal thereof is coupled to ground through capacitor 44.

The triode section of tube 20 and its associated circuitry functions as a periodically phase-controlled oscillator similar to that described in Hahnel Patent No. 2,730,264, issued January 10, 1956. If the fundamental frequency is $F_1$, and if resonant circuits 38 and 42 are tuned to a frequency $F_3$ substantially equal to a desired output multiple frequency $F_4=nF_1$, $n$ being an integer, then the output spectrum will appear as shown in Fig. 2 wherein the desired multiple output frequency $F_4=nF_1$ is a maximum in the close vicinity of $F_3$. Fig. 3 illustrates the operation of the periodically phase-controlled oscillator. The fundamental oscillation frequency $F_1$ generated by piezoelectric crystal 32 at grid 27 of tube 20 is shown in Fig. 3A. Fig. 3B represents the oscillations at the frequency $F_3$ to which both resonant circuits 38 and 42 are tuned, $F_3 \doteq F_4 = nF_1$, the desired output frequency. The fundamental frequency $F_1$ and the frequency $F_3$ are generated simultaneously. The feedback of the crystal oscillator part is determined by the ratio of the values of capacitors 40 and 44 and both capacitors are kept small enough to prevent the tuned circuits 38 and 42 from shunting the part of the network essential for satisfactory crystal oscillator operation. The choke 34 in series with crystal 32 presents a high impedance to the frequency $F_3$ without upsetting the oscillation conditions at the crystal frequency $F_1$. As the amplitude of the $F_3$ oscillations increase, the grid potential at grid 27 becomes increasingly negative thus reducing the negative resistance of the circuit, and thereby the rate of increase of the $F_3$ oscillation amplitude until an equilibrium is reached. This is represented by the duration $T_1$ and is designated as the build-up period. It is to be understood that, although preferable, it is not essential to reach such a state of equilibrium. The equilibrium period of the $F_3$ oscillations will be maintained until the beginning of the degenerative period when the oscillations at frequency $F_3$ decay exponentially as represented by the duration $T_2$. This is so because the negative voltage portion of the sine wave of curve A reduces the transconductance of the triode section of tube 20 below the value at which the higher frequency circuit is oscillatory. Thus the voltage at grid 27 may be considered to provide a bias such that there is provided a regenerative period and a degenerative period for the frequency $F_3$. The oscillation frequency $F_3$ is quenched at the crystal controlled fundamental frequency such that during the degenerative period $T_2$, the oscillations decay. In order to prevent the output from being that of a carrier which is amplitude-modulated at the fundamental frequency $F_1$, it is necessary that the oscillations $F_3$ be periodic at the fundamental frequency. This requirement is most easily fulfilled if the oscillations $F_3$ are made to disappear in the noise level of the next keying pulse as shown. Thus, the frequency $F_3$ is keyed and phase-controlled such that its output waveform is periodic at the frequency $F_1$ which is the fundamental frequency common to all available harmonic frequencies.

In the operation of the present invention, let it be assumed that it is required to control the output of VFO 16 in steps equal to the crystal frequency $F_1$. As shown, the output of VFO 16 is applied to third grid 21 where it is mixed with the narrow band frequency spectrum generated by the periodically phase-controlled oscillator. The output from the plate circuit of tube 20 is composed of components at the various beat frequencies. The lowest beat frequency component, which may vary over a range smaller than one-half of the frequency of the crystal controlled fundamental oscillation, is used as the control voltage for the automatic tuning of VFO 16 by means of reactance modulator 14 toward zero-beat. Within the catching range of this system, VFO 16 becomes phase-locked to the nearest harmonic of the reference frequency. Choosing arbitrary values, let it be assumed that $F_1$ is 1 mc. and that VFO 16 is to be synchronized with $F_4=251$ mc. In the periodically phase-controlled oscillator, resonant circuits 38 and 42 are tuned to a frequency $F_3$ close to the desired frequency, for example, $F_3=250.8$ mc. The output of the periodically phase-controlled oscillator would then consist of a spectrum of harmonically related frequencies, the amplitude envelope of which is centered at 250.8 mc. Assuming now that the VFO is at 250.7 mc., the spectrum components $nF_1$, where $n$ is an integer, like 249, 250, 251, 252, etc., generated in the periodically phase-controlled oscillator will beat together with the VFO output frequency of 250.7 mc. Thus, beat frequencies of 0.3 mc., 1.3 mc. and higher would be generated in the plate circuit of tube 20, and the output therefrom provides a control voltage which is a function of the beat frequency between VFO 16 and the output of the periodically phase-controlled oscillator. The low-pass filter 12 may be designed to have a cut-off frequency of less than one-half the fundamental frequency $F_1$, for example, 450 kc., so that all beat frequencies higher than 450 kc. will be suppressed. The VFO will thus be frequency modulated by the 0.3 mc. output from filter 12 which is applied to reactance modulator 14. When the output of the VFO passes the reference frequency, the phase of the beat frequency changes by 180 degrees thereby causing an inversion of the correction voltage and hence provide stable synchronism. At the instant when the VFO frequency is identical to the reference frequency 251 mc., phase-lock of the two signals is obtained and a direct-current component remains that is dependent only upon the phase difference between the two oscillation frequencies.

One obvious advantage of the circuit hereinabove described is the elimination of the lead-in capacities encountered where an external source of narrow pulses had been required. This results in an increase in the useful energy of the high order harmonics of the reference frequency source. Another advantage resides in the extension of the useful frequency range of operation of the VFO beyond the frequency limit of conventional circuits resulting from the minimal pulse width obtainable in pulse generator circuits.

While there has been described what is, at present, considered to be the preferred embodiment of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. In a frequency control system wherein the output of a source of oscillatory energy is stabilized at an oscillation frequency harmonically related to a prescribed reference frequency, means for deriving a control voltage related to the phase difference between said oscillatory energy and said harmonic oscillation frequency comprising: a multigrid vacuum tube having its plate output in circuit with the input of said source to control the frequency thereof and having one of its grids responsive to the output from said source, means in circuit with at least two other discrete grids and the cathode of said tube for simultaneously generating said reference frequency and a spectrum of oscillation frequencies harmonically related thereto, said spectrum generating means being responsive to said reference frequency for selectively utilizing the prescribed stabilizing harmonic oscillation frequency, said source being responsive to the beat frequency output derived from said plate when the source frequency and the harmonic frequency are not in exact synchronism such that the output frequency of said source is driven toward said prescribed harmonic frequency, the oscillation of said source and said prescribed harmonic oscillation being in phase-lock when the two frequencies are equal.

2. A discriminator for comparing the outputs of a source of oscillatory energy and a selected stabilizing oscillation frequency harmonically related to a prescribed reference frequency comprising, a multigrid vacuum tube including one grid responsive to the output of said source, means in circuit with at least two other discrete grids and the cathode of said tube for simultaneously generating said reference frequency and a spectrum of oscillation frequencies harmonically related to said reference frequency, said spectrum generating means being responsive to said reference frequency for selectively utilizing the harmonic oscillation frequency to which the output of said source is to be stabilized, the frequency output from said source and said stabilizing harmonic oscillation frequency being combined in said tube to provide a beat frequency output from the plate of said tube when said frequencies are not in synchronism and a direct-current component related to the phase difference between the oscillation frequencies when they are in synchronism.

3. A discriminator for comparing the outputs of a source of oscillatory energy and a selected stabilizing oscillation frequency harmonically related to a prescribed reference frequency comprising, a multigrid tube having at least three grids, a plate and a cathode, a piezoelectric crystal in circuit with the first and second grid for generating oscillation at said reference frequency, a first and second resonant circuit respectively coupled to said first and second grid and adapted to produce oscillations at said stabilizing harmonic frequency, said reference frequency and said stabilizing frequency being generated simultaneously whereby the harmonic frequency oscillation is keyed such that its phase is periodic at the reference frequency, said third grid being in circuit with the output from said source and said plate being in circuit with the input of said source.

4. In a circuit for controlling the output of a source of oscillatory energy in accordance with a stabilizing oscillation frequency harmonically related to a reference frequency, said circuit including a reactance modulator adapted to correct the output of said source in accordance with the amount of deviation between the source output oscillation frequency and said stabilizing oscillation frequency, means for establishing phase-lock between the output source oscillation and said stabilizing oscillation, said means comprising: a multigrid vacuum tube including one grid responsive to the output of said source, crystal controlled oscillator means in circuit with at least two other discrete grids and the cathode of said tube for simultaneously generating said reference frequency and said stabilizing harmonic oscillation frequency, said harmonic oscillation being keyed by said reference frequency such that its phase is periodic at said reference frequency, said reactance modulator being responsive to the beat frequency output derived from the plate of said tube when the source frequency and the harmonic frequency are not in exact synchronism such that the output frequency of said source is corrected toward said stabilizing frequency, the oscillation of said source and said stabilizing oscillation being in phase-lock when the two frequencies are equal.

5. A frequency spectrum generator comprising a vacuum tube having at least a plate, a grid and a cathode, a piezoelectric crystal in circuit with said grid and said plate for generating oscillations at a prescribed fundamental frequency, a first and second resonant circuit respectively coupled to said plate and said grid, each adapted to oscillate at a prescribed frequency substantially equal to a desired harmonic of the fundamental frequency, said fundamental frequency oscillation and the desired harmonic frequency oscillation being simultaneously self-excited whereby the harmonic frequency oscillation is keyed such that its phase is periodic at the fundamental frequency.

6. The discriminator in accordance with claim 2 wherein the reference frequency and the spectrum frequency generating means comprise a piezoelectric crystal in circuit with said discrete grids for generating oscillations at said reference frequency, a first and second parallel resonant circuit respectively coupled to each of said discrete grids and adapted to produce oscillations at the stabilizing harmonic frequency, said reference frequency and said stabilizing frequency being generated simultaneously whereby the harmonic frequency oscillation is keyed such that its phase is periodic at the reference frequency.

References Cited in the file of this patent

UNITED STATES PATENTS

| | | |
|---|---|---|
| 1,874,845 | Albersheim | Aug. 30, 1932 |
| 2,498,760 | Kreithen | Feb. 28, 1950 |

OTHER REFERENCES

Electronics, April 1955, pp. 164, 165, "Phase-controlled Multichannel Oscillator," Hahnel.